United States Patent
Imanishi et al.

(10) Patent No.: US 6,313,513 B1
(45) Date of Patent: Nov. 6, 2001

(54) AC SWITCH DEVICE USED FOR SWITCHING AC CIRCUIT AND AC SWITCH CIRCUIT HAVING THE AC SWITCH DEVICE

(75) Inventors: Kazuo Imanishi, Yokohama; Akihiro Iida, Ibo-gun, both of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/526,881

(22) Filed: Mar. 16, 2000

(30) Foreign Application Priority Data

Mar. 19, 1999 (JP) .................................... 11-076062

(51) Int. Cl.[7] ........................... H01L 29/76; H01L 29/94; H01L 31/062; H01L 31/113; H01L 31/119
(52) U.S. Cl. .......................... 257/401; 257/387; 257/248; 257/328; 257/329; 257/119
(58) Field of Search .................... 257/327, 328, 257/329, 119, 248, 387, 401

(56) References Cited

U.S. PATENT DOCUMENTS

| | | | |
|---|---|---|---|
| 4,199,774 | 4/1980 | Plummer | 257/124 |
| 4,656,493 | 4/1987 | Adler et al. | 257/376 |
| 4,783,690 | 11/1988 | Walden et al. | 257/140 |
| 5,003,246 | 3/1991 | Nadd | 323/349 |
| 5,608,237 | 3/1997 | Aizawa et al. | |
| 5,736,795 | 4/1998 | Zuehlke et al. | 307/130 |
| 5,965,919 | * 10/1999 | Yoo | 257/531 |
| 5,965,925 | * 10/1999 | Kornachuk et al. | 257/401 |
| 5,986,304 | * 11/1999 | Hshieh et al. | 257/330 |

FOREIGN PATENT DOCUMENTS 7-307469   11/1995   (JP) .

OTHER PUBLICATIONS

Mohamed N. Darwish, et al., "Lateral MOS–Gated Power Devices–A Unified View," IEEE Transactions on Electron Devices, vol. 38, No. 7, Jul. 1991, pp. 1600–1604.
James D. Plummer, et al., "Insulated–Gate Planar Thyristors: I–Structure and Basic Operation," IEEE Transactions on Electron Devices, vol. ED–27, No. 2, Feb. 1980, pp. 380–387.
Brad W. Scharf, et al., "Insulated–Gate Planar Thyristors: II–Quantitative Modeling," IEEE Transactions on Electron Devices, vol. ED–27, No. 2, Feb. 1980, pp. 387–394.

* cited by examiner

*Primary Examiner*—Eddie Lee
*Assistant Examiner*—Jesse A Fenty (57) ABSTRACT

An AC switch device of the present invention comprises an $n^-$ region formed on a p-type semiconductor substrate, first and second p-type regions separately formed in the $n^-$ region, a first source region ($n^+$ region) and a first sense region ($n^+$ region) separately formed in the first p-type region, a second source region ($n^+$ region) and a second sense region ($n^+$ region) separately formed in the second p-type region, first and second channel regions formed in upper parts of the first and second p-type regions located between the first source region ($n^+$ region) and the first sense region ($n^+$ region), on the one hand, and the second source region ($n^+$ region) and the second sense region ($n^+$ region), on the other, a first gate electrode formed above the first channel region with a gate insulating film interposed, and a second gate electrode formed above the second channel region with a gate insulating film interposed.

8 Claims, 8 Drawing Sheets

AC SWITCH DEVICE USED FOR SWITCHING AC CIRCUIT AND AC SWITCH CIRCUIT HAVING THE AC SWITCH DEVICE

CROSS-REFERENCE TO RELATED APPLICATIONS

This application is based upon and claims the benefit of priority from the prior Japanese Patent Application No. 11-076062, filed Mar. 19, 1999, the entire contents of which are incorporated herein by reference.

BACKGROUND OF THE INVENTION

This invention relates to an AC switch device used for switching AC circuit and an AC switch circuit having the AC switch device, which are in particular used for an AC circuit for an inverter mounted on small household electrical appliance.

Recently, inverters have become used more and more for small household electrical appliance. In this current of using inverters, an AC switch circuit as follows for switching AC at high speed has been used, as means for providing an inexpensive and high-reliable system in comparison with a DC brushless type circuit.

Figure 1:
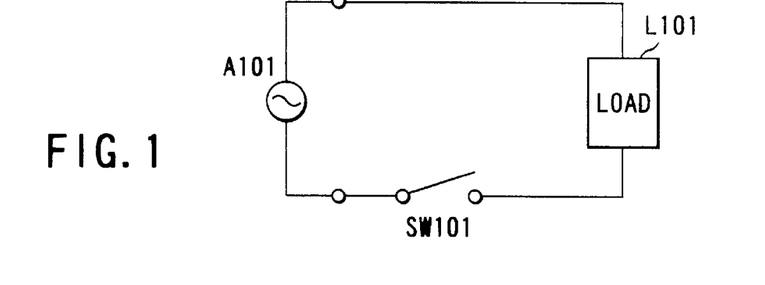
FIG. 1 is a circuit diagram showing a basic structure of an AC switch circuit.

FIG. 1 shows a circuit diagram showing a basic constitution of the AC circuit. A current flowing from an AC power supply A101 flows through a load L101 when a switch SW101 is closed, and is cut off when the switch SW101 is opened.

Figure 2:
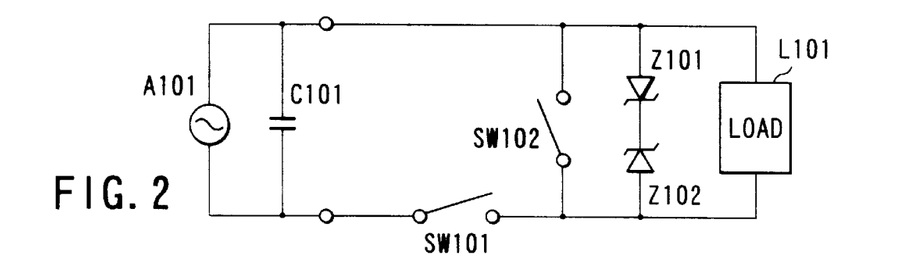
FIG. 2 is a circuit diagram showing an example of a constitution of a conventional AC switch circuit.

However, if such a circuit is actually used, as shown in FIG. 2, a switch SW102 for making a regenerative current flow when the switch SW101 is opened is provided. Further, a dead time is provided in order to prevent undesired flow of current between switches SW101–SW102, and there required bidirectional Zener diodes Z101 and Z102 for absorbing a surge generated thereby, and a capacitor C101 for absorbing a surge generated due to an impedance of the AC power supply A101.

Figure 3:
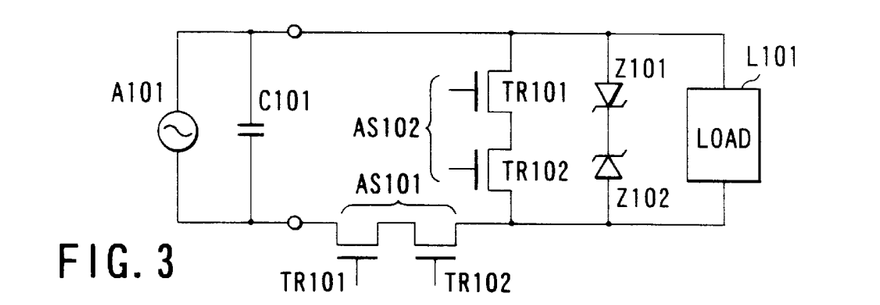
FIG. 3 is a circuit diagram showing another example of a constitution of a conventional AC switch circuit.

Further, constituting an AC switch circuit wherein a current can flow in the two directions as shown in FIG. 3 is means which are effective in respect of cost and electric power loss. In this circuit, AC switch devices AS101 and AS102 capable of running a current in the two directions are used as the switch SW101 and SW102. The AC switch devices AS101 and AS102 are made by connecting two MOS field effect transistors (hereinafter referred to as "MOSFET") in series.

However, in the AC switch device shown in FIG. 3, since two MOSFETs are connected in series, the number of the MOSFETs (elements) increases, and wiring resistance also increases. Therefore, in a conventional AC switch circuit, a number of MOSFETs having a low on-state resistance should be prepared, and there is a problem that lowering the price of the device is inhibited.

Figure 4:
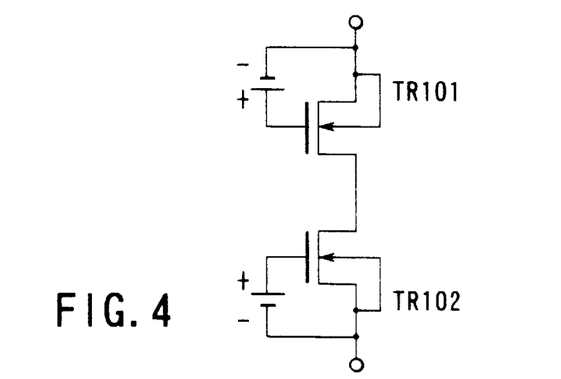
FIG. 4 is a circuit diagram showing floating-state power supplies for gate bias of an AC switch device in the AC switch circuit.

Further, with respect to gate driving circuits of the TR101 and TR102, since the source voltages are different, floating-state power supplies must be used for them as shown in FIG. 4 and the power supplies must be separated by using transformers, which complicates the circuit.

Figure 5:
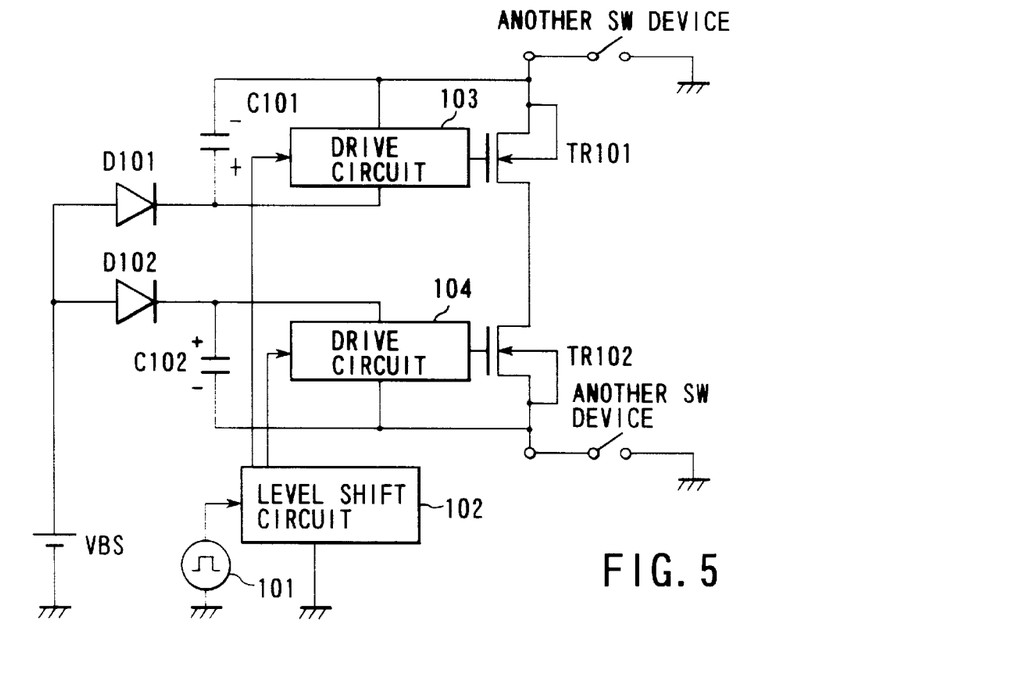
FIG. 5 is a circuit diagram wherein a floating-state power supply for gate bias of the AC switch device is achieved by a bootstrap method.

Therefore, it is generally known as an inexpensive method to use a circuit as shown in FIG. 5 comprising a bootstrap power supply VBS, a control signal generating circuit 101, a level shift circuit 102, drive circuits 103 and 104, diodes D101 and D102, and capacitors C101 and C102. However, in the case of an AC switch device, it is difficult to apply such a circuit since electric potentials of the both ends of the device are not fixed.

BRIEF SUMMARY OF THE INVENTION

Therefore, the present invention has been made in consideration of the above objects, and is aimed at providing an inexpensive AC switch device having a simple structure wherein the number of elements are reduced, and providing an AC switch circuit which can perform gate drive of the AC switch device in a good state.

In order to achieve the above objects, according to a first aspect of the present invention, there is provided an AC switch device comprising:

a first semiconductor region of a second conductivity type formed on a semiconductor substrate of a first conductivity type, the second conductivity type being different from the first conductivity type;

second and third semiconductor regions of the first conductivity type, separately formed in the first semiconductor region;

fourth and fifth semiconductor regions of the second conductivity type, separately formed in the second semiconductor region;

sixth and seventh semiconductor regions of the second conductivity type, separately formed in the third semiconductor region;

a first channel region formed in an upper part in the second semiconductor region between the fourth and fifth semiconductor regions, on the one hand, and the sixth and seventh semiconductor regions, on the other;

a second channel region formed in an upper part in the third semiconductor region between the fourth and fifth semiconductor regions, on the one hand, and the sixth and seventh semiconductor regions, on the other;

a first control electrode formed above the first channel region with an insulating film interposed; and a second control electrode formed above the second channel region with an insulating film interposed.

In an AC switch device formed as described above, if a bias is applied between the first control electrode and the second and third semiconductor regions, and between the second control electrode and the fourth and fifth semiconductor regions so that channels are formed in the first and second channel regions, a current flows in either direction in accordance with the state of applying a voltage. Thereby, an inexpensive AC switch device having a simple structure wherein the number of elements are reduced.

In order to achieve the above objects, according to a second aspect of the present invention, there is provided an AC switch circuit comprising:

a switch device which can be rendered conductive bidirectionally and have MOS transistors with current-detecting terminals;

detection circuits for detecting currents flowing through the current-detecting terminals; and control circuits for controlling voltages to be applied to gates of the MOS transistors, in accordance with detection results of the detection circuits.

In an AC switch circuit formed as described above, gate drive of the switch device can be performed in a good state by detecting currents flowing through the current-detecting terminals provided on the switch device.

In order to achieve the above objects, according to a third aspect of the present invention, there is provided an AC switch circuit comprising:

switch devices which can be rendered conductive bidirectionally and have MOS transistors;

drive circuits for supplying drive voltages to gates of the MOS transistors;

capacitors for supplying voltages to the drive circuits;

an AC power supply connected with the switch devices; and a bootstrap circuit for boosting the capacitors on the basis of a varying minimum potential in the AC power supply.

In an AC switch circuit formed as described above, gate drive of the switch devices can be performed in a good state by detecting currents flowing through the current-detecting terminals provided on the switch devices.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Embodiments of the present invention will now be described with reference to drawings. First, an AC switch device (bidirectional switch device) will be described, and next an AC switch circuit including a drive circuit for driving the device will be described.

[First Embodiment]

Figure 6:
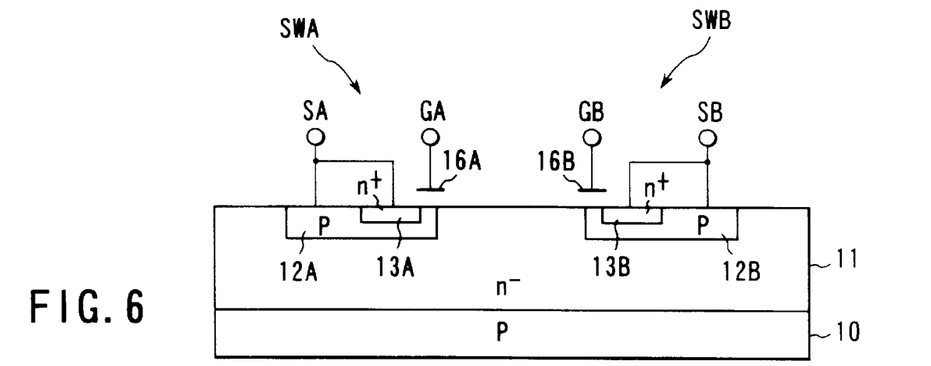
FIG. 6 is a cross-sectional view showing a constitution of an AC switch device of a first embodiment of the present invention.
Figure 7:
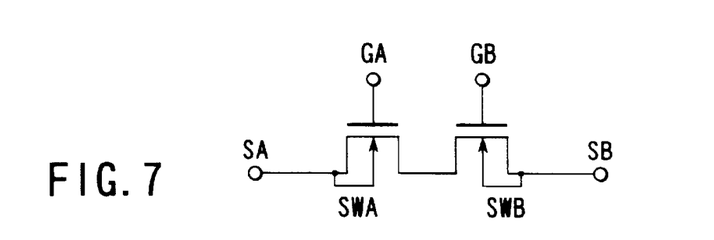
FIG. 7 is a circuit diagram of the AC switch device.

FIG. 6 is a cross-sectional view showing a constitution of an AC switch device of a first embodiment of the present invention. FIG. 7 is a circuit diagram of the AC switch device.

As shown in FIG. 6, an n-type low concentration region (hereinafter referred to as "n⁻ region") 11, which is a drain, is formed on a p-type semiconductor substrate 10. In this n⁻ region 11, two p-type regions 12A and 12B are formed. Further, in the two p-type regions 12A and 12B, n-type high concentration regions (hereinafter referred to as "n⁺ region") 13A and 13B, which are sources, are formed.

An upper part of the p-type region 12A and an upper part of the p-type region 12B, located between the n⁺ region 13A and n⁺ region 13B, are channel regions. On these channel regions, gate electrodes 16A and 16B are formed via gate insulating films. Further, a gate terminal GA is connected to the gate electrode 16A, and a gate terminal GB to the gate electrode 16B. A source terminal SA is connected to the n⁺ region 13A and the p-type region 12A. A source terminal SB is connected to the n⁺ region 13B and the p-type region 12B.

In an AC switch device having the above-mentioned constitution, a device is formed by combining two DMOS (Double-Diffused MOSFET)-type n-channel MOSFETs having a n⁻ region, which is a drain, in common. Two MOSFETs can be integrated (i.e. formed in a monolithic state) by adopting a lateral structure to the MOSFETs. Further, the drain is held in common by symmetrically arranging the sources and drains of the two MOSFETs. In the drawings, the left switch element is indicated as SWA, and the right switch element is SWB.

In the two switch elements SWA and SWB forming such an AC switch device, by applying a positive bias between the gate terminal GA and the source SA, and between the gate terminal GB and the source SB, the p regions of the channel regions are inverted and inverse layers (channel) are formed, and a current flows from one switch element and the other switch element. If a bias voltage is applied between the gate GA and source SA and between the gate GB and the source SB so that the two switch elements SWA and SWB are closed, a current flows even if a voltage is applied to either of sources SA and SB. In the meantime, in the state where the two switch elements SWA and SWB are opened, there is no path through which a current flows, since cathodes of the parasitic diodes of the elements are connected.

Next, a drive circuit of the AC switch device shown in FIG. 6 will now be described.

Figure 8:
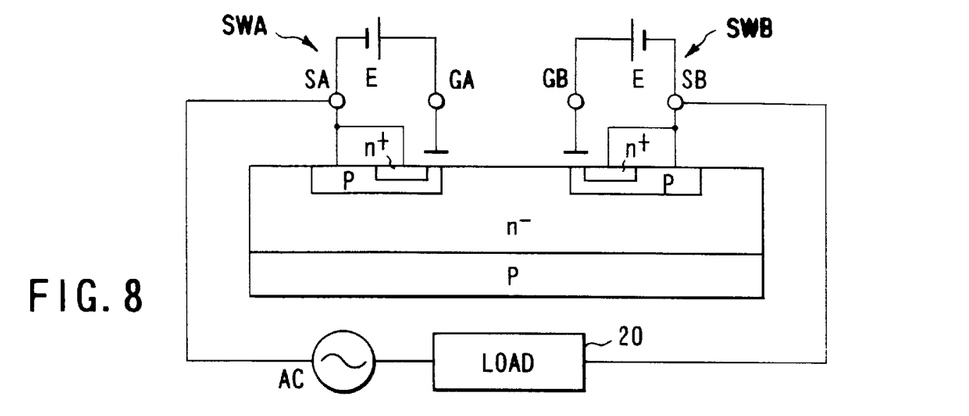
FIG. 8 is a circuit diagram for considering a drive circuit of the AC switch device.
Figure 9:
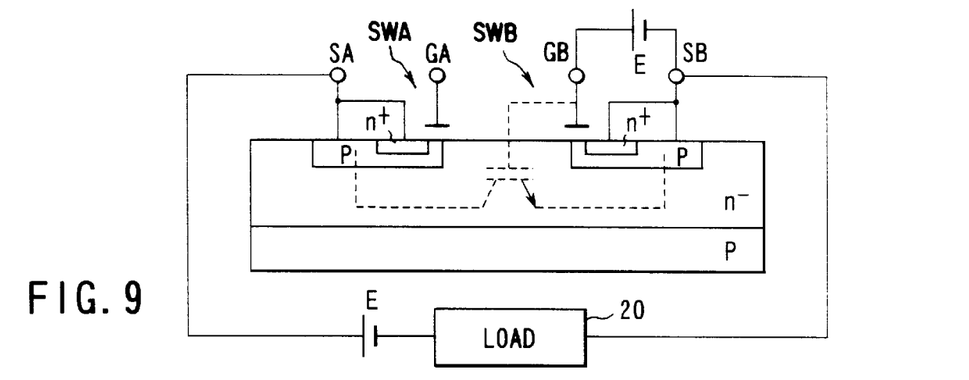
FIG. 9 is another circuit diagram for considering the drive circuit of the AC switch device.

FIG. 8 and FIG. 9 are circuit diagrams for considering the drive circuit of the AC switch device.

As shown in FIG. 8, a positive bias is applied by power supplies E between the gate terminal GA and the source SA and between the gate terminal GB and the source SB, the switch elements SWA and SWB are closed and a current flows from an AC power supply AC to a load 20.

Now, in the circuit shown in FIG. 8, considered is the case where a positive bias to the gate of the switch element SWA is stopped to come into the state as shown in FIG. 9. In this case, the p region of the switch element SWA, wherein the bias is stopped, moves in the same manner as a collector of an IGBT, as shown in FIG. 9. Therefore, the AC switch device comprising the switch elements SWA and SWB operates as an IGBT. However, in order to use the device as a switch of an AC line, the device shown in FIG. 6 must apply and stop the bias between the gate and source of one switch element, in accordance with the direction of the current.

Figure 10:
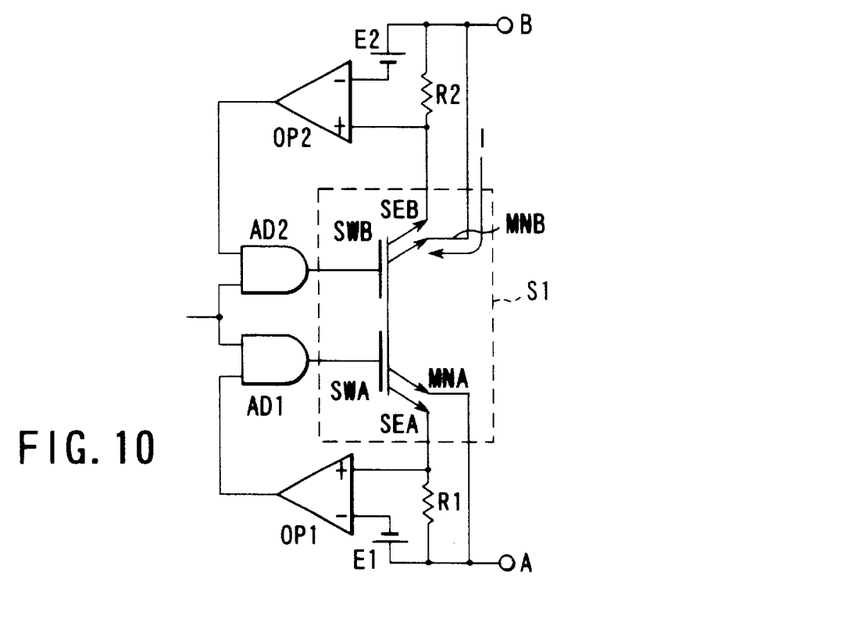
FIG. 10 is a circuit diagram showing a constitution of a drive circuit of an AC switch device having a current-detecting function.
Figure 11:
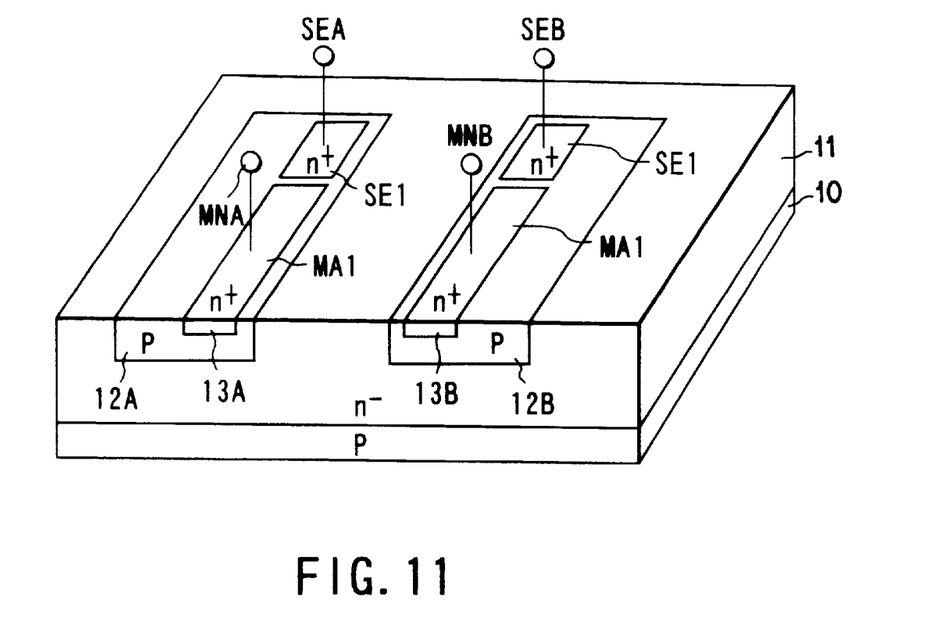
FIG. 11 is a perspective view showing a constitution of the AC switch device.
Figure 12:
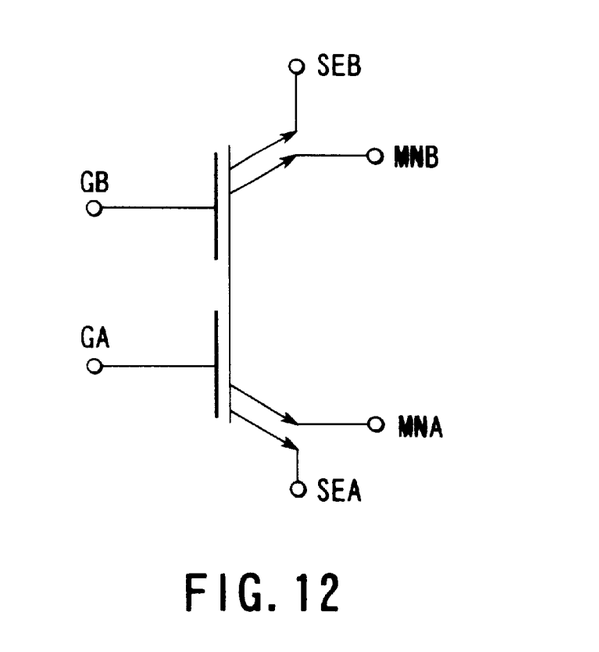
FIG. 12 is a circuit diagram of the AC switch device.

Therefore, it is necessary to form a drive circuit having a function of detecting the direction of a current. FIG. 10 is a circuit diagram showing a constitution of a drive circuit of an AC switch device having a current detecting function. FIG. 11 is a perspective view showing a constitution of the AC switch device used in FIG. 10. FIG. 12 is a circuit diagram of the AC switch device. In FIG. 11, only the p-type regions 12A and 12B and the $n^+$ regions 13A and 13B are shown.

In this AC switch device, as shown in FIG. 11, a part of the $n^+$ region 13A, which is the source region, is separated in the device shown in FIG. 6, and the separated region is used as a sense region SE1 for detecting a current. In the same manner, a part of the $n^+$ region 13B which is the source region is separated, and the separated region is used as a sense region SE1 for detecting a current. The rest of the source regions are indicated as MA1. Sense terminals SEA and SEB are connected to the sense regions SE1. Main terminals MNA and MNB are connected to the source regions MA1. The AC switch device shown in FIGS. 11 and 12 is an MOSFET provided with a current sensor formed as described above. The other structure of the AC switch device is similar to the device shown in FIG. 6.

In the AC switch device shown in FIG. 11 and FIG. 12, the current is divided by an area ratio of the sense region SE1 to the source region MA1 on the pattern. For example, if the sense region SE1 and the source region MA1 has the area ratio of N:1, the current also flows with the ratio of N:1.

Next, the drive circuit shown in FIG. 10 will be described. As shown in FIG. 10, a terminal A is connected to a main terminal MNA of a switch element SWA in an AC switch device S1, and connected to a sense terminal SEA of the switch element SWA via a resistance R1, and to a negative terminal of an operational amplifier OP1 via a power supply E1. A node of the resistance R1 and the sense terminal SEA is connected to a positive terminal of the operational amplifier OP1. An output terminal of the operational amplifier OP1 is connected to a first terminal of an AND circuit AD1.

Further, a terminal B is connected to a main terminal MNB of a switch element SWB, and connected to a sense terminal SEB of the switch element SWB via a resistance R2, and to a negative terminal of an operational amplifier OP2 via a power supply E2. A node between the resistance R2 and the sense terminal SEB is connected to a positive terminal of the operational amplifier OP2. An output terminal of the operational amplifier OP2 is connected to a first terminal of an AND circuit AD2. Further, second terminals of the AND circuits AD1 and AD2 are connected.

The drive circuit formed as described above detects the direction of a current and its current value with the sense terminals SEA and SEB of the MOSFET provided with current sensor, and turns off a gate-source bias of the MOSFET when a detected current value exceeds a predetermined value. For example, if the voltage to be applied to the terminal A is set to a positive level, and the voltage to be applied to the terminal A is set to a negative level, a gate-source bias of the switch element SWB into which the current flows is turned off. Further, the switch element SWB operates as a collector of an IGBT until the direction of the current is reversed thereafter. When the waveform of the alternating current is inverted and the direction of the current is reversed, the gate-source bias of the switch element SWB is turned on, and the switch element SWB operates as a MOSFET.

Figure 13:
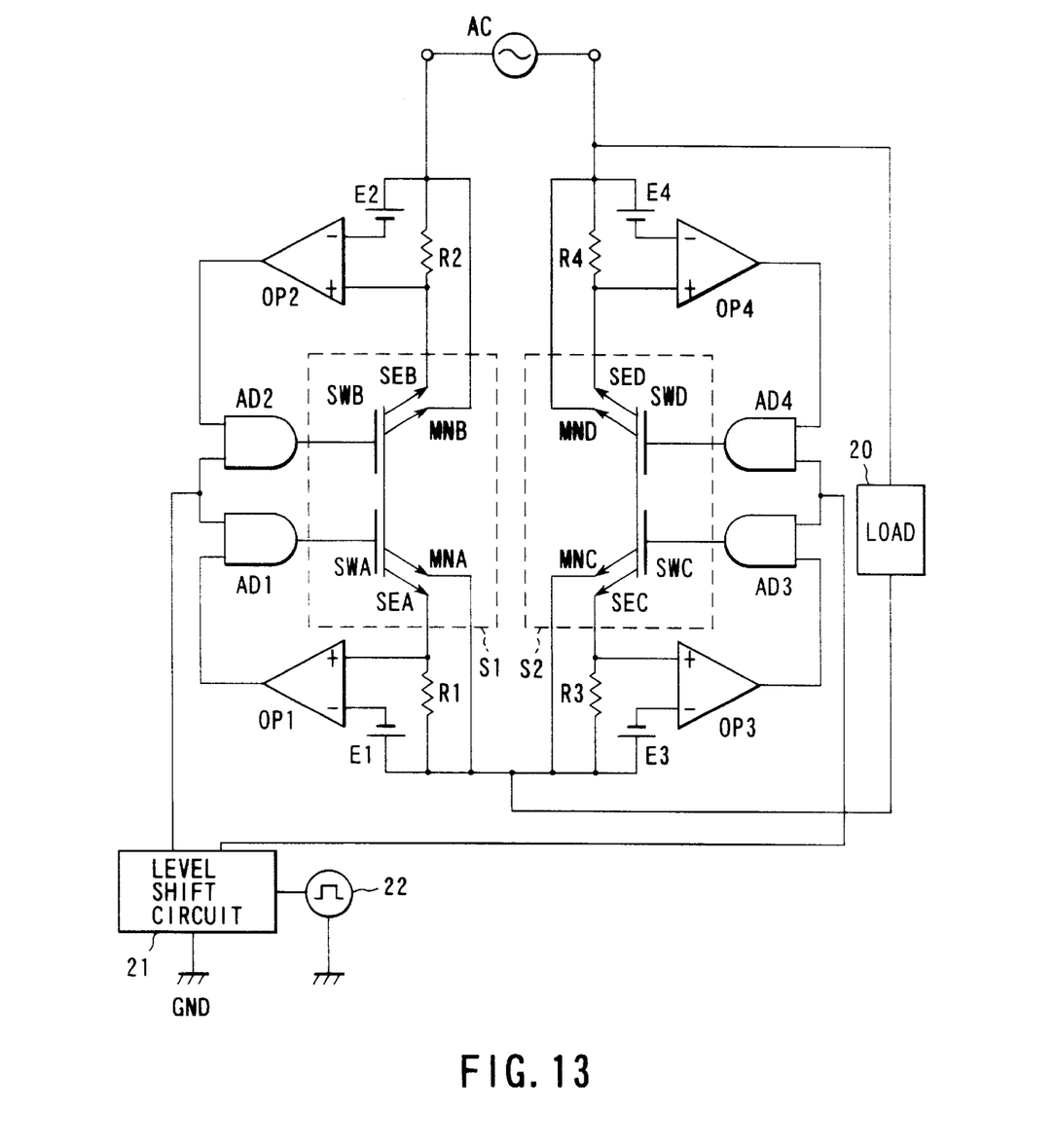
FIG. 13 is a circuit diagram in the case where the drive circuit shown in FIG. 10 is applied to an AC switch circuit.

Further, if the drive circuit shown in FIG. 10 is applied to the AC switch circuit shown in FIG. 3, a circuit as shown in FIG. 13 is obtained.

The AC switch circuit shown in FIG. 13 is formed as shown in the drawing, wherein the drive circuit including an AC switch device S1 is connected in series to an power supply line connecting an AC power supply AC and a load 20, and the drive circuit including an AC switch device S2 is connected in parallel to the load 20.

Second terminals of AND circuits AD1 and AD2 connected to the gate of the AC switch device S1 are connected, and an output part of a level shift circuit 21 is connected to the node of the terminals. Further, a control signal generating circuit 22 is connected to the level shift circuit 21.

When the first embodiment is used, in the AC switch device S1 (or S2), an IGBT can be formed by turning off one of the switch elements SWA and SWB (or SWC and SWD) in accordance with the direction of the current, and a switch for switching an alternating current can be formed without combining a complicated circuit and a single IGBT. Further, since an MOSFET and IGBT can be freely switched in accordance with the current value, the switch device can be used as an IGBT in a large current state wherein a voltage generated by an on-state resistance is high, and a low collector-emitter voltage $V_{ce}$ can be achieved. Further, the switch device can be set to operate as a MOSFET in a low current state (wherein a voltage generated by an on-state resistance is low) wherein loss of diode VF characteristic of IGBT becomes a problem. Thereby, there can be achieved a switch with an electric power loss further lower than that in the case of using a single IGBT.

[Second Embodiment]

Next, an AC switch circuit of a second embodiment of the present invention will now be described.

Figure 14:
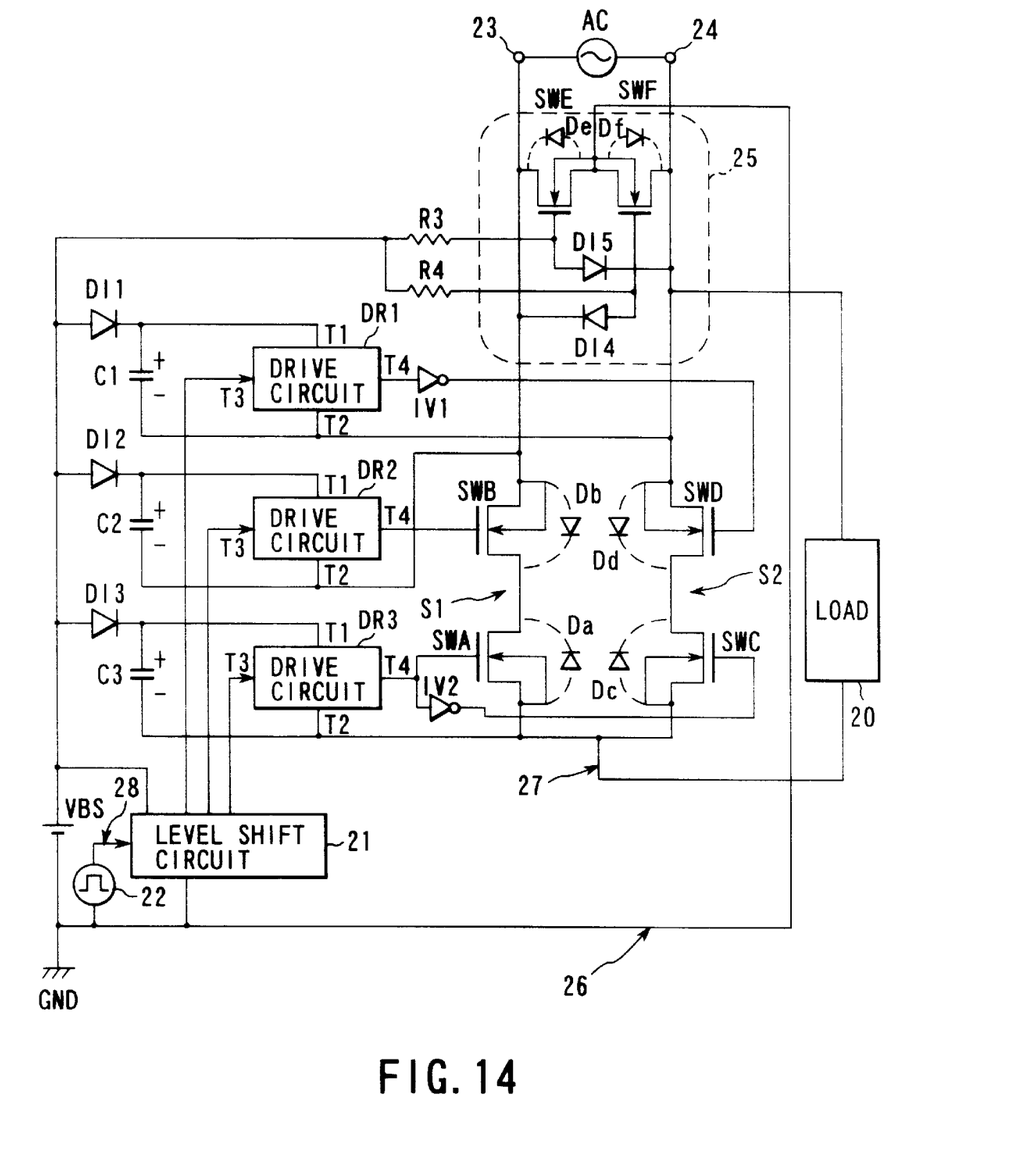
FIG. 14 is a circuit diagram showing a constitution of an AC switch circuit of a second embodiment of the present invention.

FIG. 14 is a circuit diagram of a constitution of an AC switch circuit of the second embodiment of the present invention.

As shown in FIG. 14, a positive-voltage side of a bootstrap power supply VBS is connected to a first terminal T1 of a drive circuit DR1 via a diode DI1. In the same manner, the positive voltage side of the bootstrap power supply VBS is connected to a first terminal T1 of a drive circuit DR2 via a diode DI2, and to a first terminal T1 of a drive circuit DR3 via a diode DI2. A cathode of the diode DI1 is connected to a second terminal T2 of the drive circuit DR1 and to a source of a switch element SWD via a capacitor C1. In the same manner, a cathode of the diode DI2 is connected to a second terminal T2 of the drive circuit DR2 and a source of a switch element SWB via a capacitor C2. A cathode of the diode DI3 is connected to a second terminal T2 of the drive circuit DR3 and sources of switch elements SWA and SWC, and one end of a load 20 via a capacitor C3.

Further, a positive-voltage side of the bootstrap power supply VBS, a reference voltage source(GND), and an output portion of a control signal generating circuit 22 are connected to a level shift circuit 21. The reference voltage source (GND) is connected to the control signal generating circuit 22. Further, an output portion of a level shift circuit 21 is connected to third terminals T3 of the drive circuits DR1, DR2 and DR3. An output terminal T4 of the drive circuit DR1 is connected to a gate of the switch element SWD via an inverter IV1. An output terminal T4 of the drive circuit DR2 is connected to a gate of the switch element SWB. Further, an output terminal T4 of the drive circuit DR3 is connected to a gate of the switch element SWA, and to a gate of the switch element SWC via an inverter IV2. Furthermore, drains of the switch elements SWA and SWB, and drains of the switch elements SWC and SWD are connected.

Further, a drain of a switch element SWE, a cathode of a diode DI4, and the source of the switch element SWB are connected to a terminal 23 of an AC power supply AC. A drain of a switch element SWF, a cathode of a diode DI5, the source of the switch element SWD, and the other end of the load 20 are connected to the other end 24 of the AC power supply AC.

The positive-voltage side of the bootstrap power supply VBS is connected to a gate of the switch element SWE and an anode of the diode DI5 via a resistance R3. Furthermore, the positive-voltage side is connected to a gate of the switch element SWF and an anode of the diode DI4 via a resistance R4. Sources of the switch elements SWE and SWF are connected, and a node of the sources is connected to the reference voltage.

Figure 15:
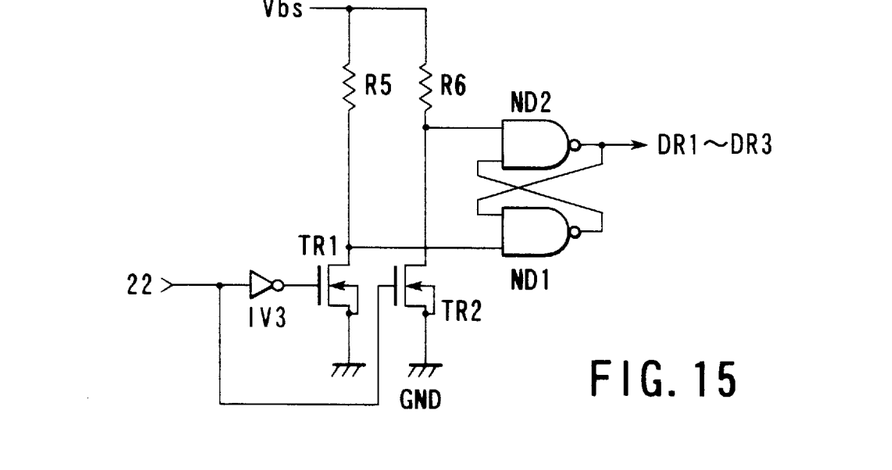
FIG. 15 is a circuit diagram showing an example of a constitution of a level shift circuit in the AC switch device.

FIG. 15 is a circuit diagram showing an example of a constitution of the level shift circuit 21. The level shift circuit 21 supplies the drive circuits DR1–DR3 with a control signal outputted from the control signal generating circuit 22, on the basis of the reference voltage (GND). A signal Vbs outputted from the bootstrap power supply VBS is inputted in a first terminal of a NAND circuit ND1 and in a drain of an n-channel MOS transistor (hereinafter referred to as "nMOS transistor") TR1 via a resistance R5. Further, the signal Vbs is inputted in a first terminal of a NAND circuit ND2 and a drain of an nMOS transistor TR2 via a resistance R6. A GND is supplied to sources of these nMOS transistors TR1 and TR2.

Further, an output signal of the NAND circuit ND1 is inputted in a second terminal of the NAND circuit ND2. An output signal of the NAND circuit ND2 is outputted to the drive circuits DR1–DR3, and inputted in a second terminal of the NAND circuit ND1. Furthermore, a control signal outputted from the control signal generating circuit 22 is inputted in a gate of the nMOS transistor TR1 via an inverter IV3, and the control signal is inputted in a gate of the nMOS transistor TR2.

In a level shift circuit formed as described above, source-grounded high-voltage FETs (TR1, TR2) used for on/off switching are provided. Further, a control signal outputted from the control signal generating circuit 22 is converted to a current by a mutual conductance gm of the FET, and converted to a signal based on the bootstrap power supply VBS by the resistance R5 and R6 on a reception side. When a control signal outputted from the control signal generating circuit 22 is "H", a level-converted signal is outputted from the NAND circuit ND2 to the drive circuits DR1–DR3. On the other hand, when the control signal is "L", the reference voltage is outputted from the NAND circuit ND2 to the drive circuits DR1–DR3.

Figure 16:
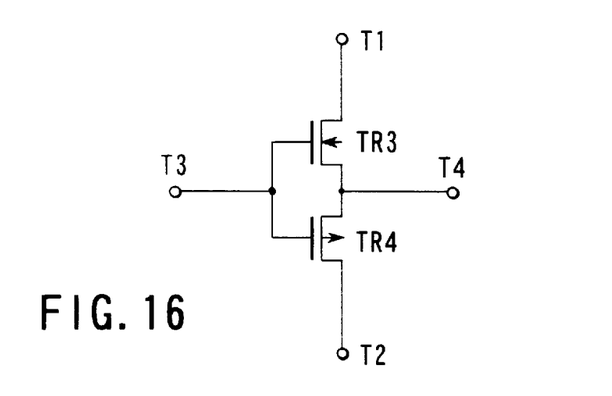
FIG. 16 is a circuit diagram showing an example of a constitution of a drive circuit in the AC switch circuit.

Further, each of the drive circuits DR1–DR3 is formed of a circuit wherein nMOS transistor TR3 and PMOS transistor TR4 are connected as shown in FIG. 16, for example. When a signal "H" is inputted from the level shift circuit 21 to a third terminal T3, the nMOS transistor TR3 is turned on, and pMOS transistor TR4 is turned off, and a signal Vbs is outputted to the switch device S1 or S2. In the meantime, when a signal "L" is inputted from the level shift circuit 21 to the third terminal T3, the PMOS transistor TR4 is turned on, and the NMOS transistor TR3 is turned off, and a reference voltage is outputted to the switch device S1 or S2.

The operation of the AC switch circuit shown in FIG. 14 formed as described above is as follows.

An AC switch device (bidirectional switch device) S1 shown in FIG. 14 comprises the switch elements SWA and SWB whose drains are connected. An AC switch device (bidirectional switch device) S2 comprises the switch elements SWC and SWD whose drains are connected.

A bias is applied to each gate of the switch elements SWA-SWD by potentials of the capacitors C1–C3 charged by the bootstrap power supply via the drive circuits.

The switch elements SWA and SWC constituting a contact point between the two switches S1 and S2 are driven by the same power supply, since their sources are connected and they have an equal reference potential. Further, separate power supplies are necessary for the switch elements SWB and SWD. Therefore, three bootstrap power supply circuits in total will suffice. However, since AC power varies alternately, boosting needs to be always performed with a reference level set at a minimum potential, in order to form bootstrap power supplies.

A circuit denoted by reference numeral 25 in FIG. 14 is a circuit for solving this problem. The switch elements SWE and SWF are aimed at varying a potential of a ground side of the power supply of a bootstrap circuit for supplying a floating-state power supply to the switch elements SWA–SWD, in accordance with an AC minimum potential. Therefore, the switch elements SWE and SWF always operate so as to vary the potential of the ground side in accordance with the potential of one of the terminals 23 and 24 having lower potential than that of the other.

Now, suppose that the potential of the terminal 23 is higher than the potential of the terminal 24, the GND of the bootstrap power supply VBS is brought to the potential of the terminal 24 by a parasitic diode Df of the switch element SWF. Thereby, contact potentials of sources of the switch elements SWE and SWF are V24+VF, which is obtained by adding to a potential V24 of the terminal 24 a voltage VF equal to a voltage reduced from the voltage of the diode Df. In the meantime, the potential of a gate of the switch element SWE is also V24+VF by a diode DI5. Therefore, the switch element SWE is not turned on, but the switch element SWF is turned on, and the GND of the bootstrap power supply VBS is connected to a power supply line of the terminal 24 via an on-state resistance of the MOSFET constituting the SWF. Thereby, the capacitor C1 is charged.

In the meantime, if the potential of the terminal 24 is higher than the potential of the terminal 23, the GND of the bootstrap power supply VBS is brought to the potential of the terminal 23 in the same manner by a parasitic diode De of the switch element SWE. Thereby, the contact potentials of the sources of the switch elements SWE and SWF are V23+VE, which is obtained by adding potential V23 of the terminal 23 a voltage VE equal to the voltage reduced from the voltage of the diode De. In the meantime, the potential of a gate of the switch element SWF is also V23+VE by the diode DI4. Therefore, the switch element SWF is not turned on, but the switch element SWE is turned on, and the GND of the bootstrap power supply VBS is connected to a power supply line of the terminal 23 via an on-state resistance of the MOSFET constituting the SWE. Thereby, the capacitor C2 is charged.

A negative-electrode side of the capacitor C3 is connected to a power supply line of terminal 23 or 24 having a minimum potential via the parasitic diode Da, Dc of the switch element SWA or SWC, when the switch element SWB or SWD is turned on and the source side has the minimum potential. Thereby, the capacitor C3 is charged.

Figure 17:
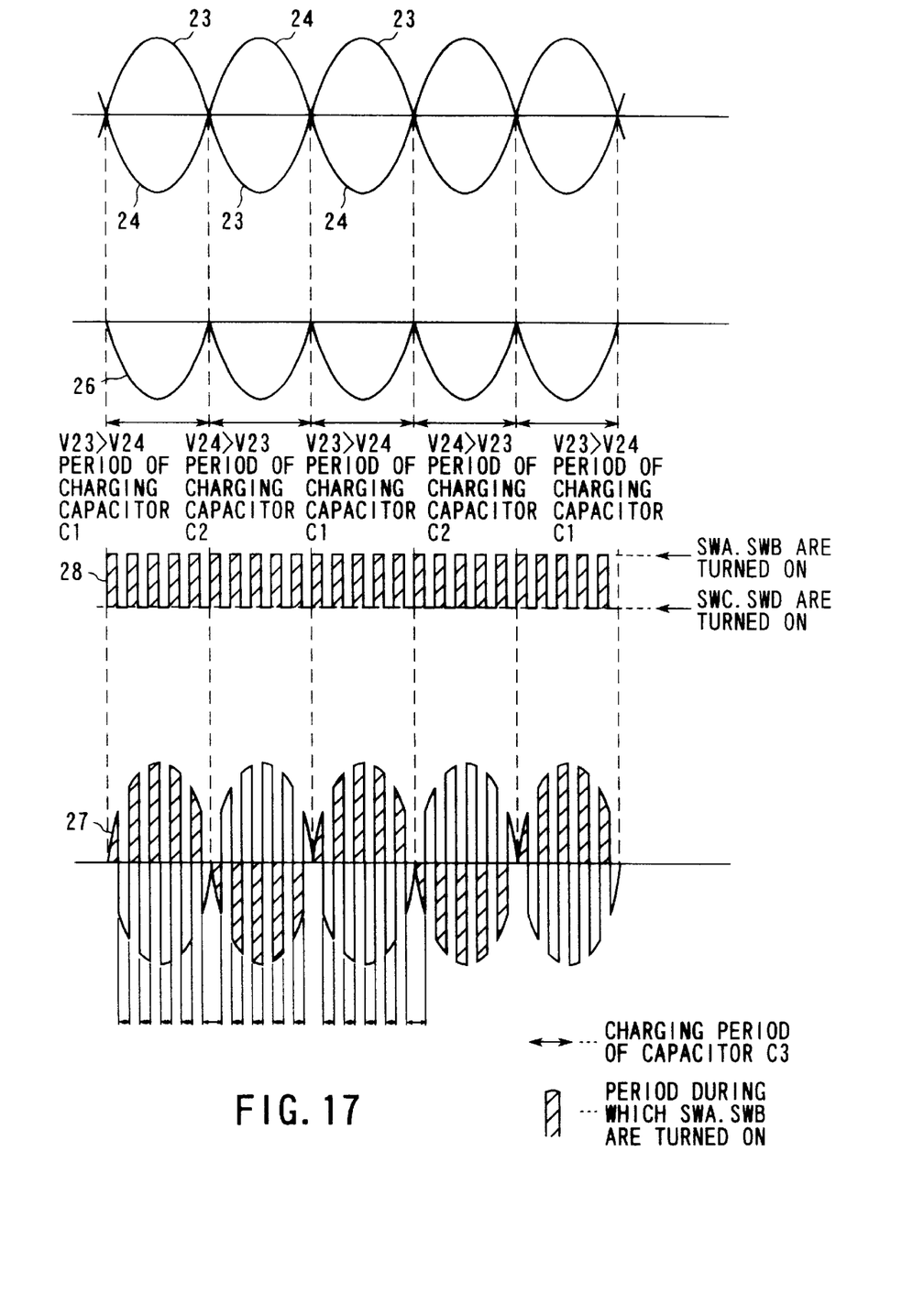
FIG. 17 is a timing chart of the time of charging capacitors in the AC switch circuit.

After the capacitors C1–C3 are charged, since each of the capacitors generate a voltage of Vbs as a bootstrap power supply, the gate control of the switch elements SWA-SWD becomes irrelevant to the AC power supply, and performed by switching pulses outputted from the drive circuits DR1–DR3. At this time, timing of charging the capacitors C1–C3 are as shown in FIG. 17. The reference numerals or symbols in FIG. 17 denote the terminal or line in the circuit diagram of FIG. 14.

Figure 18:
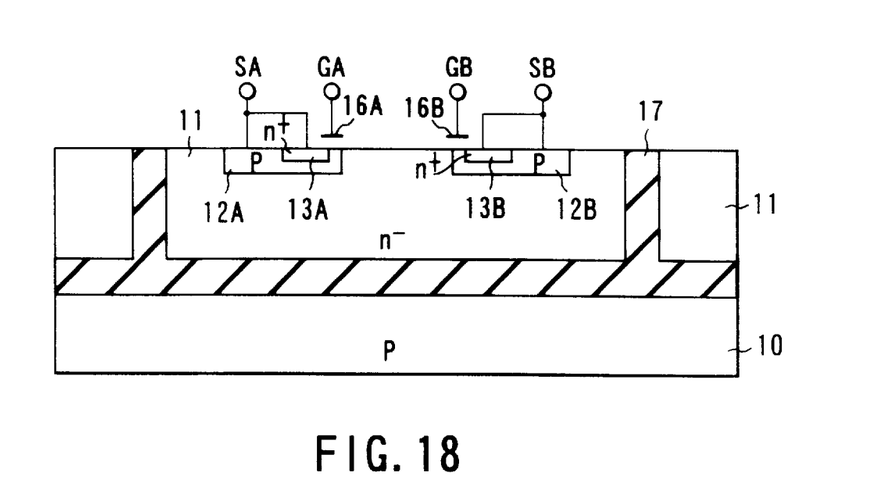
FIG. 18 is a cross-sectional view showing a constitution of an AC switch circuit having an SOI structure.

Further, a switch device having an SOI (Silicon on Insulator) structure as shown in FIG. 18 may be used as an AC switch device (bidirectional switch device) used for the above AC switch circuit. FIG. 18 is a typical cross-sectional view showing a constitution of the AC switch elements SWA and SWB (and SWC, SWD).

As shown in FIG. 18, an insulating film, for example, a silicon oxide film ($SiO_2$) 17 is formed on a p-type semiconductor substrate 10. On the silicon oxide film 17, an n-type low concentration region (hereinafter referred to as "$n^-$ region") 11, a drain, is formed. Two p-type regions 12A and 12B are formed in the $n^-$ region 11. Further, n-type high concentration regions (hereinafter referred to as "$N^+$ region") 13A, 13B, which are sources, are formed in the two p-type regions 12A and 12B.

An upper part of the p-type region 12A and an upper part of the p-type region 12B, located between the $n^+$ region 13A and the $n^+$ region 13B, are channel regions. On these channel regions, gate electrodes 16A and 16B are formed via gate insulating films. Further, a gate terminal GA is connected to the gate electrode 16A, and a gate terminal GB is connected to the gate electrode 16B. A source terminal SA is connected to the $n^+$ region 13A and the p-type region 12A. A source terminal SB is connected to the $n^+$ region 13B and the p-type region 12B.

In an AC switch device having the above-mentioned constitution, a device is formed by combining two DMOS (Double-Diffused MOSFET)-type n-channel MOSFETs having an $n^-$ region, which is a drain, in common. Two MOSFETs can be integrated (i.e. formed in a monolithic state) by adopting a lateral structure to the MOSFETs. Further, the drain is held in common by symmetrically arranging the sources and drains of the two MOSFETs.

In the two MOSFETs forming such an AC switch device, by applying a positive bias between the gate terminal GA and the source SA, and between the gate terminal GB and the source SB, the p regions of the channel regions are inverted and inverse layers (channel) are formed, and a current flows from one MOSFET and the other MOSFET. If a bias voltage is applied between the gate GA and source SA and between the gate GB and the source SB so that the two MOSFETs are closed, a current flows even if a voltage is applied to either of source SA and SB. In the meantime, in the state where the two MOSFETs are opened, there is no path through which a current flows, since cathodes of the parasitic diodes of the elements are connected. By the above structure, an AC switch device can be formed on an integrated circuit using dielectric isolation.

According to an AC switch device having such an SOI structure, a bidirectional switch device capable of performing inexpensive and high-speed switching can be achieved, by applying an integrated circuit using dielectric isolation. Further, though there is a fear of malfunction due to noise in the case of using a discrete circuit, by forming two MOSFETs in a monolithic state as in this embodiment, a stable operation becomes possible without malfunction due to noise generated in switching.

As described above, according to this second embodiment a floating-state power supply operated by an AC power supply can be obtained at a low cost, and gate drive of a bidirectional switch device formed of a semiconductor device can be performed in a good state in an AC circuit.

As described above, according to the present invention, an inexpensive AC switch device having a simple structure with a reduced number of elements can be provided. Further, an AC switch circuit which can perform gate drive of the AC switch device in a good state can be provided.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An AC switch device comprising:
    a first semiconductor region of a second conductivity type formed on a semiconductor substrate of a first conductivity type, the second conductivity type being different from the first conductivity type;
    second and third semiconductor regions of the first conductivity type, separately formed in the first semiconductor region;
    fourth and fifth semiconductor regions of the second conductivity type, separately formed in the second semiconductor region;
    sixth and seventh semiconductor regions of the second conductivity type, separately formed in the third semiconductor region;
    a first channel region formed in an upper part in the second semiconductor region between the fourth and fifth semiconductor regions, on the one hand, and the sixth and seventh semiconductor regions, on the other;
    a second channel region formed in an upper part in the third semiconductor region between the fourth and fifth semiconductor regions, on the one hand, and the sixth and seventh semiconductor regions, on the other;
    a first control electrode formed above the first channel region with an insulating film interposed; and
    a second control electrode formed above the second channel region with an insulating film interposed.

2. An AC switch device of claim 1, wherein one of the fourth and fifth semiconductor regions, and one of the sixth and seventh semiconductor regions are regions for detecting a current.

3. An AC switch device of claim 1, further comprising an insulating film is formed between the semiconductor substrate and the first semiconductor region.

4. An AC switch circuit comprising:
    a switch device which can be rendered conductive bidirectionally and have MOS transistors with current-detecting terminals;

detection circuits for detecting currents flowing through the current-detecting terminals; and control circuits for controlling voltages to be applied to gates of the MOS transistors, in accordance with detection results of the detection circuits.

5. An AC switch circuit of claim 4, wherein the detection circuits are operational amplifiers, and the control circuits are AND gate circuits.

6. An AC switch circuit of claim 4, wherein the MOS transistors with the cur ent-detecting terminals comprises:

a first semiconductor region of a second conductivity type formed on a semiconductor substrate of a first conductivity type, the second conductivity type being different from the first conductivity type;

second and third semiconductor regions of the first conductivity type, separately formed in the first semiconductor region;

fourth and fifth semiconductor regions of the second conductivity type, separately formed in the second semiconductor region;

sixth and seventh semiconductor regions of the second conductivity type, separately formed in the third semiconductor region;

a first channel region formed in an upper part in the second semiconductor region between the fourth and fifth semiconductor regions, on the one hand, and the sixth and seventh semiconductor regions, on the other;

a second channel region formed in an upper part in the third semiconductor region between the fourth and fifth semiconductor regions, on the one hand, and the sixth and seventh semiconductor regions, on the other;

a first control electrode formed above the first channel region with an insulating film interposed; and a second control electrode formed above the second channel region with an insulating film interposed.

7. An AC switch circuit of claim 6, wherein one of the fourth and fifth semiconductor regions, and one of the sixth and seventh semiconductor regions are regions for detecting a current.

8. An AC switch circuit of claim 6, further comprising an insulating film is formed between the semiconductor substrate and the first semiconductor region.

* * * * *